United States Patent [19]
Blake

[11] Patent Number: 6,122,415
[45] Date of Patent: Sep. 19, 2000

[54] IN-LINE ELECTRO-OPTIC VOLTAGE SENSOR

[76] Inventor: James N. Blake, 5528 E. Michele Dr., Scottsdale, Ariz. 85254

[21] Appl. No.: 09/163,750

[22] Filed: Sep. 30, 1998

[51] Int. Cl.$^7$ ............................... G02B 6/00; C01R 31/00
[52] U.S. Cl. ....................... 385/12; 250/227.17; 356/351; 324/96
[58] Field of Search ................................. 385/12; 324/96, 324/95; 250/227.11, 227.12, 227.17, 227.19, 227.21; 356/351, 365

[56] References Cited

U.S. PATENT DOCUMENTS

| | | | |
|---|---|---|---|
| 4,968,881 | 11/1990 | Takahashi et al. | 324/96 |
| 4,975,635 | 12/1990 | Takahashi et al. | 324/96 |
| 5,420,686 | 5/1995 | Takahashi et al. | 356/351 |
| 5,644,397 | 7/1997 | Blake | 356/345 |
| 5,696,858 | 12/1997 | Blake | 385/12 |
| 5,715,058 | 2/1998 | Bohnert et al. | 356/365 |
| 5,731,579 | 3/1998 | Woods | 385/12 |
| 5,969,341 | 10/1999 | Ito et al. | 250/227.11 |

FOREIGN PATENT DOCUMENTS 0175358  3/1986  European Pat. Off. .

*Primary Examiner*—Hemang Sanghavi

[57] ABSTRACT

A voltage sensor utilizing a non-reciprocal phase shift induced by a time variation of an electric field of the voltage to be measured. A light source provides broadband light to a polarizer. The polarized light is distributed to two linear polarizations. The two polarizations of light are provided with a dynamic or static phase shift relative to each other before or after being birefringently modulated with an electro-optic sensor in accordance with the electric field of a voltage to be measured. The modulated light goes through a delay line that is terminated with a quarter-wave plate and mirror. The quarterwave plate may be an optical fiber. The portion of light entering the quarter-wave device in a first polarization is reflected in a second polarization and the portion of light entering the quarter-wave device in the second polarization is reflected in the first polarization. The electro-optic sensor again birefringently modulates the light. The light is converted to electrical signals that are processed into a signal representing a non-reciprocal phase shift that is proportional to the sensed electric field. The latter signal is integrated into a signal proportional to the electric field of the voltage to be measured.

39 Claims, 3 Drawing Sheets

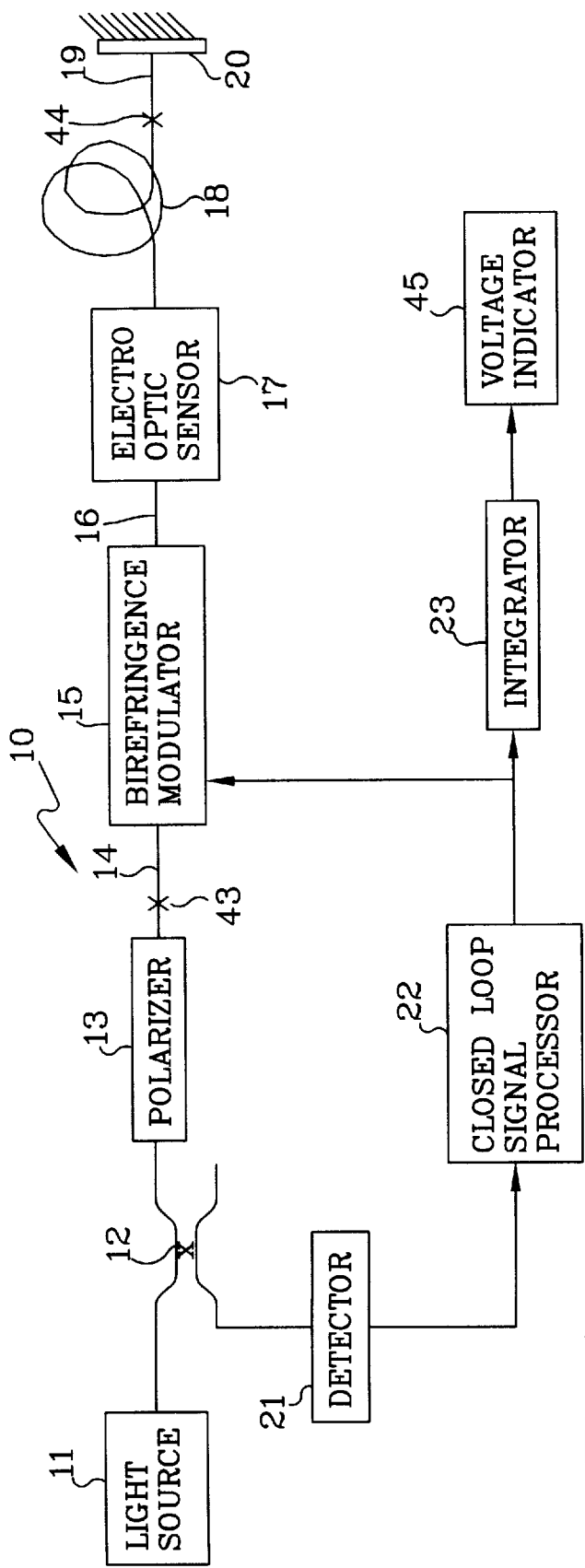
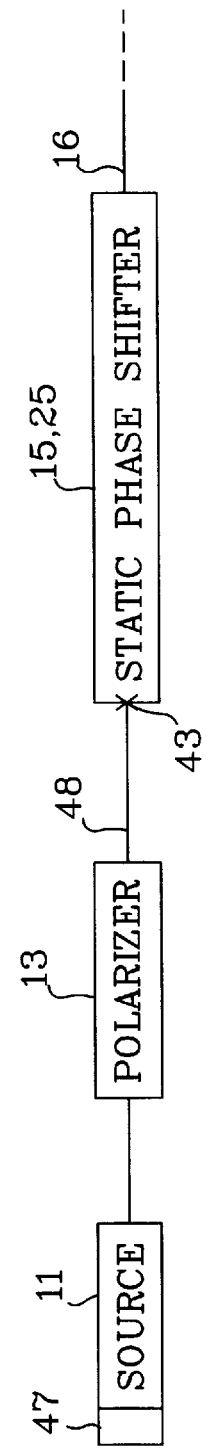

IN-LINE ELECTRO-OPTIC VOLTAGE SENSOR

BACKGROUND

The invention pertains to fiber optic sensors and, particularly, to fiber optic voltage sensors.

Over the past decade, fiber optic sensors have received attention in the application of magnetic field sensing and current sensing. Fiber optic current sensors are advantageous over iron-core current transformers, since fiber optic sensors are non-conductive and lightweight. Furthermore, fiber optic sensors also do not exhibit hysteresis and provide a much larger dynamic range and frequency response.

Fiber optic current sensors work on the principle of the Faraday effect. Current flowing in a wire induces a magnetic field, which, through the Faraday effect, rotates the plane of polarization of the light traveling in the optical fiber wound around the current carrying wire. Faraday's law, stated as $$I = \oint H \cdot dL$$

where I is the electrical current, H is the magnetic field and the integral is taken over a closed path around the current. If the sensing fiber is wound around the current carrying wire with an integral number of turns, and each point in the sensing fiber has a constant sensitivity to the magnetic field, then the rotation of the plane of polarization of the light in the fiber depends on the current being carried in the wire and is insensitive to all externally generated magnetic fields such as those caused by currents carried in nearby wires. The angle, $\Delta\phi$, through which the plane of polarization of light rotates in the presence of a magnetic field is given by $$\Delta\phi = V \oint H \cdot dL$$

where V is the Verdet constant of the fiber glass. The sensing optical fiber performs the line integral of the magnetic field along its path, which is proportional to the current in the wire, when that path closes on itself. Thus, one has $\Delta\phi = VNI$ where N is the number of turns of sensing fiber wound around the current carrying wire. The rotation of the state of polarization of the light due to the presence of an electrical current is measured by injecting light with a well defined linear polarization state into the sensing region, and then analyzing the polarization state of the light after it exits the sensing region. Alternatively, $\Delta\phi$ represents the excess phase shift encountered by a circularly polarized light wave propagating the sensing fiber.

This technology is related to the in-line optical fiber current sensor as disclosed in U.S. Pat. No. 5,644,397 issued Jul. 1, 1997, to inventor James N. Blake and entitled "Fiber Optic Interferometric Circuit and Magnetic Field Sensor", which is incorporated herein by reference. Optical fiber sensors are also disclosed in U.S. Pat. No. 5,696,858 issued Dec. 9, 1997, to inventor James N. Blake and entitled "Fiber Optics Apparatus and Method for Accurate Current Sensing", which is incorporated herein by reference.

However, a need has arisen for a fiber optic voltage sensor.

SUMMARY OF THE INVENTION

The present invention utilizes a non-reciprocal phase shift induced by a time variation of an electric field of the voltage to be measured. A light source provides broadband light to a polarizer. The polarized light is distributed to two linear polarizations. The two polarizations of light are provided with a dynamic or static phase shift either before or after being birefrigently modulated with an electro-optic sensor in accordance with the electric field of a voltage to be measured. The modulated light goes through a delay line that is terminated with a quarter-wave plate and mirror. The quarter-wave plate maybe an optical fiber. The portion of light entering the quarter-wave device in a first polarization is reflected in a second polarization and the portion of light entering the quarter-wave device in the second polarization is reflected in the first polarization. The electro-optic sensor again birefringently modulates the light. The light is converted to electrical signals that are processed into a signal representing a non-reciprocal phase shift that is proportional to the sensed electric field. The latter signal is integrated into a signal proportional to the electric field of the voltage to be measured. The intensity of the electric field indicates the magnitude of the voltage.

BRIEF DESCRIPTION OF THE DRAWINGS

FIGS. 1a and 1b show the optical architecture of the voltage sensor.

DESCRIPTION OF THE EMBODIMENT

Figure 2:
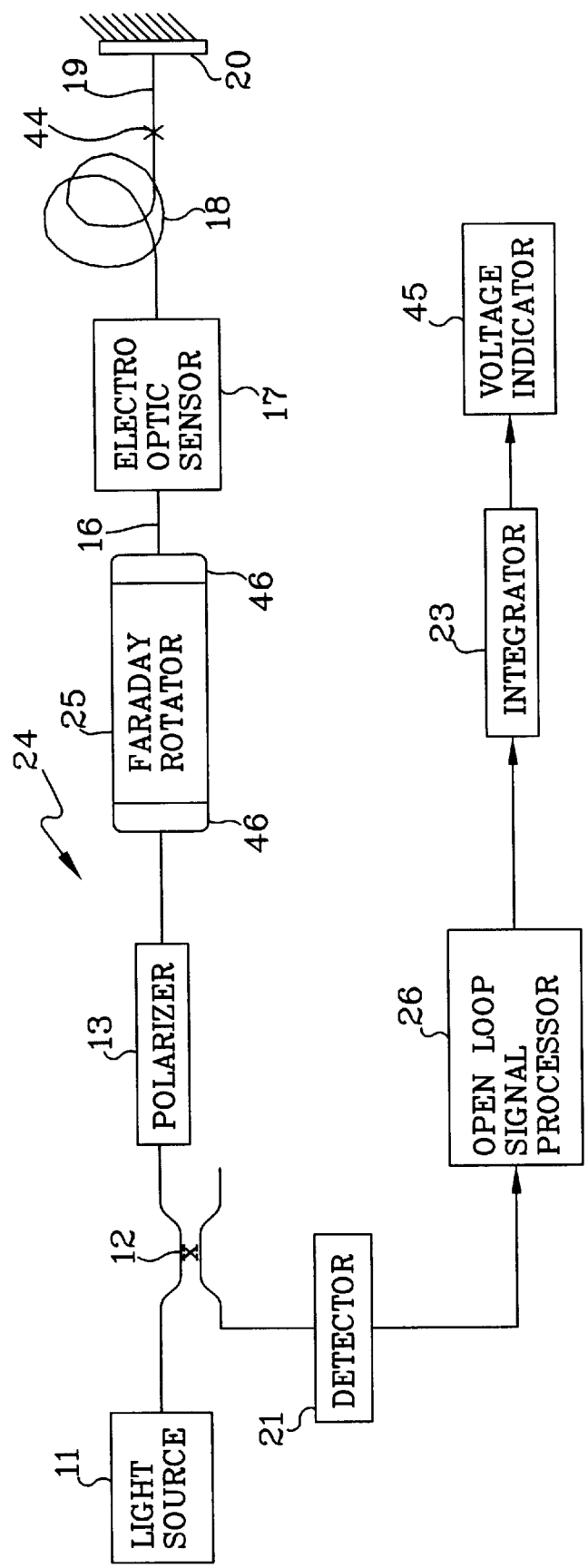
FIG. 2 shows the optical architecture but with Faraday rotator in lieu of a birefringence modulator.

FIG. 1a shows an embodiment of a voltage sensor 10 having a dynamic phase shift between the polarizations of light. It is a closed-loop system. A light source 11 emits light that goes through coupler 12 and onto polarizer 13. Coupler 12 and detector 21 may be excluded with the returning light going to and through light source 11 to a backfacet photodiode 47 at the back of light source 11, as shown in FIG. 1b. Further, polarizer 13 may have a pigtail 48 that is coupled directly to modulator 15 having a connection 43 with the principal birefringence axes of pigtail 48 and modulator 15 aligned at 45 degrees. The output fiber of polarizer 13 is connected to a polarization-maintaining (PM) input fiber 14 of birefringence modulator 15. The axes of this connection 43 are aligned at 45 degrees to distribute the light evenly in both polarization axes of PM fiber 14. Light travels through modulator 15 in both polarization axes and down a PM fiber 16 to an electro-optic (i.e., electric field) sensitive element 17. Modulator 15 provides a bias modulation of the birefringence between the two axes of polarization of light medium in modulator 15. The bias modulation occurs at a frequency of about several hundred kilohertz (for example, 300 kHz). Electro-optic sensor 17 provides additional birefringence modulation at about 60 hertz, since the voltage being measured would be that of a 60 hertz power line. The electric field, say, from the voltage being monitored, modulates the birefringence between the two light waves in sensor 17. The light from sensor 17, enters a PM fiber delay line 18, which has axes aligned with sensor 17, and is connected to and terminated by a quarter-wave plate or PM fiber 19 and a mirror 20, via connection 44, such that light traveling down fibers 18 and 19 in the x-axis returns in the y-axis and vice versa. The axes of delay line 18 and termination 19 are at a 45-degree alignment at connection 44. The light returns from fiber 18 to sensor 17 and receives further birefringence modulation. The two portions of the light entering fiber 19 in the first (x) and second (y) polarizations, respectively, return from fiber 19 in the other polarizations, that is, in the second (y) and first (x) polarizations, respectively. The birefringence modulation on the two waves is not canceled for ac fields because of the delay time between the passage of the two waves through sensor 17. The light then travels from sensor 17 through fiber 16, modulator 15, fiber 14, polarizer 13 and coupler 12 to detector 21.

The output of detector 15 is an electrical representation of the light waves entering the detector. The AC (i.e., alternating current) fields detected are typically of a low frequency compared to the delay time introduced by delay line 18 between sensing element 17 and mirror 20. In this case, the non-reciprocal phase shift introduced is proportional to the time derivative of the field to be sensed. Closed-loop signal processing electronics 22 may be incorporated to take in the signal from detector 21 and provide a feedback signal to birefringence modulator 15. This signal has a non-reciprocal phase-shift, as noted above, which is proportional to the time derivative of the field to be sensed. Thus, the signal may be integrated by integrator 23 to yield an output proportional to the field sensed by the element 17. The output signal from integrator 23 goes to a voltage indicator 45, which provides the voltage reading of measuring device 10 with respect to the voltage being measured at sensor 17.

An analysis of device 10 of FIG. 1 is shown below. Phase difference modulation is $Q_x(t)-Q_y(t)$ There are similarities to the in-line current sensor. BM(t) is birefringence modulation. $BM_1$ represents the modulation of birefringence modulator 15 and $BM_2$ represents the modulation of electro-optic sensor 17. Going from source 11 to mirror 20, one has $Q_x(t)$ and $Q_y(t)$ of the light intensity for the x and y polarizations. Going from mirror 20 to detector 21, one has $Q_x(t+\tau)$ and $Q_y(t+\tau)$ of the light intensity. Formulas for explaining phase difference modulation are noted.

$$Q_x(t)-Q_y(t)-Q_x(t+\tau)+Q_y(t+\tau)$$

$$BM(t) \equiv Q_x(t)-Q_y(t)$$

Phase difference modulation is $BM(t)-BM(t-\tau)$

For bias modulation at the eigen frequency, $BM_1(t+\tau)=-BM_1(t)$

Sensor modulation is $BM_2(t)-BM_1(t+\tau)=-\tau(dBM_2(t)/dt)$

Total modulation is $2BM_1(t)-\tau(dBM_2(t)/dt)$ where:
$-\tau(dBM_2(t)/dt)$ is the quasi-static non-reciprocal phase shift. The loop output is $-\tau(dBM_2/dt)$ and the output is $-\tau TBM_2$. $BM_2$ is proportional to the voltage being measured.

FIG. 2 is a device 24 that is similar to device 10 of FIG. 1a, except that birefringence modulator 15 is replaced with a Faraday rotator 25. The alternate light source 11 and detector 47 arrangement of FIG. 1b may be used in lieu of the coupler 12 and detector 21 arrangement of system 24. System 24 is an open-loop device having a static phase shift. Light from source 11 goes through coupler 12. From coupler 12, the light is polarized by polarizer 13. The output light of polarizer 13 goes to Faraday rotator 25, which passively rotates the polarization of the light about 22.5 degrees.

Faraday rotator 25, in lieu of birefringence modulator 15, results in a lower cost device although with somewhat lower performance. Faraday rotator 25 has a quarter-wave plate 46 at each end. Rotator 25 could have just one plate 46 at the end towards polarizer 13. A bulk optic rotator 25 may have a sliver of quartz glued to the respective end as a quarter-wave plate 46. The output of Faraday rotator 25 goes to electro-optic sensor 17 which provides birefringence modulation at about 60 hertz. The magnitude of an electric field from the voltage being measured or monitored modulates the birefringence between the two polarization axes of the medium of the two light waves that propagate respectively in sensor 17. The light from sensor 17 enters a PM optical fiber delay line 18 which is terminated by, via connection 44, a quarter-wave plate or PM fiber 19 and a mirror 20, such that light traveling down fibers 18 and 19 in the x-axis returns in the y-axis and light in the y-axis returns in the x-axis. The birefringence axes of PM fiber 18 are aligned with the axes of sensor 17 and are at 45 degrees with the axes of quarter-wave plate or fiber 19. The light returns from fiber 18 to sensor 17 and receives further birefringence modulation. The light goes through rotator 25, which includes at least one quarter-wave plate 46, polarizer 13 and coupler 12, and on to detector 21. The output of detector 21 is an electrical representation of the light waves entering the detector. A non-reciprocal phase shift is introduced which is proportional to the time derivative of the field to be sensed. Open-loop signal processor 26 may be incorporated to process the electrical signal from detector 21 and provide a signal that is proportional to the time derivative of the field being sensed, to integrator 23. Integrator 23 yields a signal that is proportional to the electric field sensed by element 17. The signal from integrator 23 goes to a voltage indicator 45 that provides the voltage reading of device 24.

Figure 3:
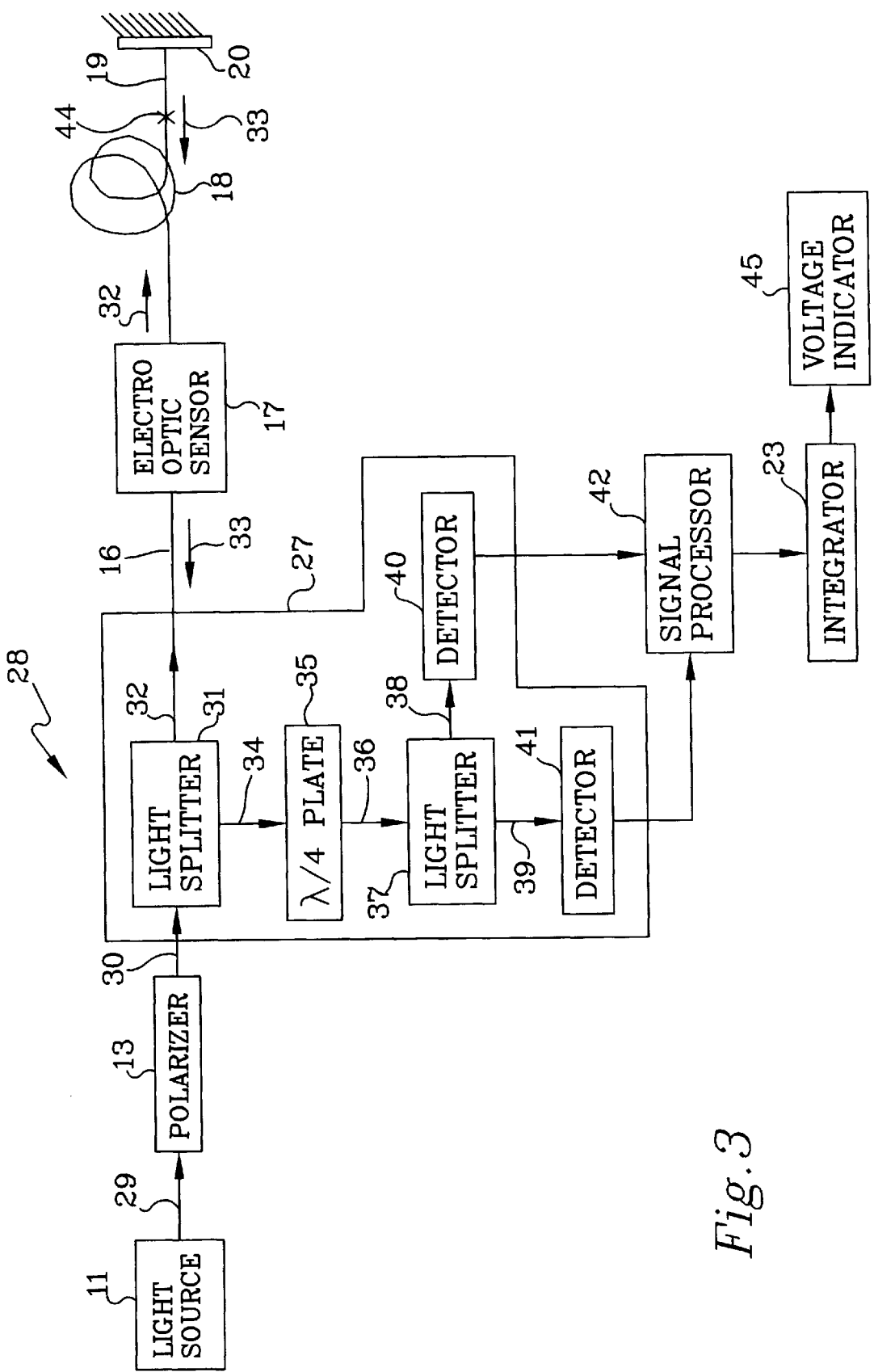
FIG. 3 illustrates a partial bulk optics configuration with a particular signal processing aspect.

FIG. 3 shows a bulk optics alternative 27 for birefringence modulator 15 or Faraday rotator 25 of FIGS. 1 and 2, respectively, for a third configuration 28. System 28 is an open-loop device having a static phase shift of the light polarizations. Light 29 comes from source 11 and goes through polarizer 13 to a passive two-polarization detection device 27. Light 29 is polarized into a first direction by polarizer 13. Light 30 of a first polarization enters device 27 and goes to a light splitter 31. About half of beam 30 is reflected out of and dumped from splitter 31. The remaining portion of beam 30, which is designated beam 32, goes to polarization maintaining (PM) fiber 16. Fiber 16 has polarization axes that are aligned at about 45 degrees relative to the axes of polarizer 13. In other words, a PM fiber 16 is connected to the polarized output of device 27 at axis angles of 45 degrees. Light 32 is now distributed in the two axes of linear polarizations of fiber 16. Light 32 goes from fiber 16 to electro-optic sensor 17. Sensor 17 birefringently modulates light 32 in accordance with a sensed electric field of a voltage to be measured. The birefringence modulation of the light medium of electro-optic sensor 17 results in a nonreciprocal phase shift of the light waves in the first (x) and second (y) polarizations of beam 32, that is proportional to a time derivative of the electric field of the voltage that is being measured. Light 32 from sensor 17 goes to delay line 18, quarter-wave length plate or fiber 19 and is reflected by mirror 20. Optical fiber delay line 18 is about 10 to 100 meters of polarization maintaining fiber that has birefringence polarization axes that are aligned with such axes of electro-optic sensor 17. The quarter-wave plate or PM fiber 19 has its birefringence axes aligned at about 45 degrees to the axes of delay line 18. Fiber 19 is terminated with a mirror 20.

Light 32 is reflected back from mirror 20 as a light 33. The first portion of light beam 32 is of the first polarization and the second portion of light beam 32 is of the second polarization. When the light of beam 32 is reflected back, the first portion of beam 32 is of the second polarization and the second portion is of the first polarization. This is designated as light 33. Light 33 goes through sensor 17 and is further modulated. Delay line 18 prevents the second birefringence modulation of light 33 from canceling the first modulation of light 32, because of the delaying of the light by delay line 18. Light 33 then goes through fiber 16 from sensor 17, to device 27. Light 33 enters splitter 31 and a portion of light 33 is reflected to quarter-wave plate. The other portion of light 33 passes through splitter 31, polarizer 13 and to light source 11. This portion of light 32 is dumped. Light 33 reflected to a quarter wave plate 35 is designated has light 34 which as a first portion of light in the first polarization and a second portion of light in the second polarization. Quarter-wave plate 35 introduces a 90-degree static phase shift bias between the first and second portions of light 34. This 90 degree biased light is designated as light 36. Plate 35 is a bulk optics substitute for birefringence modulator 15 of configuration 10 in FIG. 1, and Faraday rotator 25 of configuration 24 in FIG. 2.

From plate 35, light 36 goes to a prism or polarization sensitive splitter 37. A first portion of light 36 is of the first polarization and is designated as light 38. A second portion of light 36 is of the second polarization and is designated as light 39. Polarization sensitive splitter 37 reflects one portion of light 36 as light 38 of the first polarization to detector 40 and another portion of light 36 as light 39 of the second polarization to detector 41. Detectors 40 and 41 may be photodiodes. Detector 40 sends out electrical signals or currents representative of light 38. Detector 41 sends out electrical signals or currents representative of light 39. Detectors 40 and 41 are connected to a signal-processing device 42. Processor 42 takes the signals from detectors 40 and 41 and processes them. With signal 38 designated as signal $I_1$, and signal 39 designated as $I_2$, processor 42 processes the signals according to a formula $(I_1-I_2)/(I_1+I_2)$, into a signal representing the non-reciprocal phase shift that is proportional to a time derivative of the electric field of the voltage being measured. The output of processor 42 is sent to integrator 23, which integrates the signal from processor 42 into a signal proportional to the electric field. The signal from integrator 23 goes to a voltage indicator 45, which provides the voltage reading of measuring device 28 of the voltage at sensor 17.

I claim:

1. A fiber optic voltage sensor comprising:
    a light source;
    a polarizer connected to said light source;
    a phase shifter connected to said polarizer;
    an electric field sensitive birefringence modulator connected to said phase shifter;
    a delay line connected to said electric field sensitive birefringence modulator;
    a quarter-wave device connected to said delay line; and
    a reflective device connected to said quarter-wave device.

2. The sensor of claim 1, further comprising a detector proximate to said polarizer for detecting birefringently modulated light.

3. The sensor of claim 2, further comprising:
    a signal processor connected to said detector; and
    an integrator connected to said signal processor.

4. The sensor of claim 3, wherein said phase shifter is a birefringence modulator.

5. The sensor of claim 3, wherein said phase shifter is a Faraday rotator.

6. The sensor of claim 3, wherein said phase shifter is a quarter-wave plate.

7. A fiber optic voltage sensor comprising:
    a light source;
    a polarizer connected to said light source;
    a birefringence modulator connected to said polarizer;
    an electro-optic sensor connected to said birefringence modulator;
    a delay line connected to said electro-optic sensor;
    a quarter-wave device connected to said delay line; and
    a reflective device connected to said quarter-wave device.

8. The sensor of claim 7, wherein said electro-optic sensor is for being proximate to an electric field of a voltage to be measured.

9. The sensor of claim 8, wherein said electro-optic sensor has a birefringence that is changed upon a presence of an electric field.

10. The sensor of claim 9, further comprising a detector proximate to said polarizer for detecting birefringently modulated light reflected back through said electro-optic sensor and birefringence modulator.

11. The sensor of claim 10, further comprising:
    a signal processor connected to said detector; and
    an integrator connected to said signal processor.

12. The sensor of claim 11, wherein said signal processor provides a feedback signal to said birefringence modulator, which provides a phase-shift signal that nulls out the non-reciprocal phase shift caused by said electro-optic sensor due to the presence of the electric field of the voltage to be measured.

13. The sensor of claim 12, wherein the phase-shift signal from said signal processor is proportional to a time derivative of the electric field and is integrated to yield a signal representing a magnitude of the voltage to be measured.

14. The sensor of claim 13, wherein said detector is a photodiode situated at said light source.

15. The sensor of claim 13, further comprising a coupler connected to said light source and detector.

16. An optical voltage sensor comprising:
    a light source;
    a polarizer proximate to said light source;
    a first splitter proximate to said polarizer;
    an electric field sensitive phase shifter proximate to said splitter;
    a delay line proximate to said electric field sensitive phase shifter;
    a first quarter-wave device connected to said delay line;
    a reflective termination connected to said quarter-wave device;
    a second quarter-wave device proximate to said first splitter;
    a second splitter proximate to said second quarter-wave device;
    a first detector proximate to said second splitter;
    a second detector proximate to said second splitter; and
    a signal processor connected to said first and second detectors.

17. The sensor of claim 16, further comprising an integrator connected to said signal processor.

18. The sensor of claim 16, further comprising a voltage indicator connected to said integrator.

19. A voltage sensor comprising:
    means for providing light;
    means for polarizing light, connected to said means for providing light;
    first means for splitting light, connected to said means for polarizing light;
    means for phase shifting light in response to an electric field of a voltage;
    means for delaying and reflecting light in an opposite polarization;

means for receiving and phase shifting reflected light from said first means for splitting light;

second means for splitting light, the light being split into a first beam of a first polarization and a second beam of a second polarization;

first means for converting the first beam into a first electrical signal;

second means for converting the second beam into a second electrical signal; and means for processing the first and second electrical signals into a third electrical signal indicative of the electric field of the voltage.

20. The sensor of claim 19, comprising means for integrating the third electrical signal that is proportional to a time derivative of the electric field of the voltage, into a fourth electrical signal that is proportional to the electric field of the voltage, and in turn indicative of a magnitude of the voltage.

21. A voltage sensor comprising:

a light source;

a polarizer connected to said light source;

a birefringence modulator connected to said polarizer;

an electro-optic sensor connected to said birefringence modulator;

a delay line connected to said electro-optic sensor; and a quarter-wave reflective termination connected to said delay line.

22. The voltage sensor of claim 21, wherein said electro-optic sensor is for being proximate to an electric field of a voltage to be measured.

23. The voltage sensor of claim 22, further comprising:

a coupler connected between said light source and polarizer;

a detector connected to said coupler; and a signal processor connected to said detector.

24. The voltage sensor of claim 22, further comprising:

a detector proximate to said light source; and a signal processor connected to said detector.

25. The voltage sensor of claim 24, further comprising an integrator connected to said signal processor.

26. The voltage sensor of claim 25, wherein said signal processor provides a bias modulation signal to said birefringence modulator.

27. The voltage sensor of claim 26, wherein said signal processor provides a feedback signal which provides a phase shift signal that nulls out the non-reciprocal phase shift which is caused by the electro-optic sensor due to the electric field of the voltage being measured, and is proportional to a time derivative of the electric field.

28. The voltage sensor of claim 27, wherein the phase-shift signal from said signal processor is integrated by said integrator to yield a signal representing a magnitude of the voltage being measured.

29. A voltage sensor wherein:

light from a source goes to a polarizer;

light of a first linear polarization exits from said polarizer in a first polarization maintaining optical fiber;

light of the first linear polarization goes to a second polarization optical fiber via a connection having axes of said first and second polarization maintaining optical fibers aligned at about 45 degrees, thereby resulting in light of the first linear polarization and a second linear polarization in said second polarization maintaining optical fiber;

light of the first and second linear polarizations goes from said second polarization maintaining fiber to a birefringence modulator;

said birefringence modulator provides a bias modulation, caused by a bias modulation signal from a signal processor, of a birefringence between first and second polarization axes of a light medium in said birefringence modulator, thereby affecting the phase relationship between light of the first and second polarizations;

light from said birefringence modulator goes through a third polarization maintaining fiber to an electro-optic sensor;

said electro-optic sensor provides a modulation of birefringence between the first and second polarization axes of a light medium in said electro-optic sensor, the modulation caused by an electric field of a voltage being measured, thereby resulting in a non-reciprocal phase shift between light of the first and second polarizations;

light from said electro-optic sensor goes to a delay line and a quarter-wave optical termination that reflects light of the first polarization as light of the second polarization and reflects light of the second polarization as light of the first polarization;

light of second and first polarizations returns through said delay line to said electro-optic sensor;

said electro-optic sensor again provides a modulation of birefringence between the first and second polarization axes of the light medium in said electro-optic sensor, thus resulting in further non-reciprocal phase shift between light of the first and second polarizations;

light from said electro-optic modulator goes through said third polarization maintaining fiber to said birefringence modulator for further bias modulation of the phase relationship between the light of the first and second polarizations;

light from said birefringence modulator goes through said second polarization maintaining fiber onto said first polarization maintaining fiber via the connection of said first and second polarization maintaining fibers;

light from said first polarization maintaining fiber goes through said polarizer; and light from said polarizer goes to a detector that provides a first electrical signal representative of the light, to a processor;

a second electrical signal from said processor goes to an integrator; and a third electrical signal from said integrator indicates an intensity of the electric field that in turn indicates a magnitude of the voltage to be measured.

30. A voltage sensor comprising:

a light source;

a polarizer connected to said light source;

a Faraday rotator connected to said polarizer;

an electro-optic sensor connected to said Faraday rotator;

a delay line connected to said electro-optic sensor; and a quarter-wave reflective termination connected to said delay line; and wherein said electro-optic sensor is proximate to an electric field of a voltage to be measured.

31. The fiber optic voltage sensor of claim 30, wherein said Faraday rotator rotates a polarization state of light about 22.5 degrees.

32. The fiber optic voltage sensor of claim 30, further comprising:

a detector connected to said polarizer; and a signal processor connected to said detector.

33. The voltage sensor of claim 32, wherein:

said delay line is a polarization maintaining optical fiber; and said delay line and said quarter wave termination have polarization axes aligned with one another.

34. The voltage sensor of claim 33, wherein:

said light source provides light that goes to said polarizer;

polarized light goes from said polarizer to said Faraday rotator;

said Faraday rotator passively biases the light with a static phase shift between light of a first polarization and light of a second polarization;

the light of the first and second polarizations goes to said electro-optic sensor;

said electro-optic sensor provides birefringence modulation affecting first and second polarizations, resulting in non-reciprocal phase shift between light of the first polarization and light of the second polarization, in accordance with the electric field of the voltage being measured;

light goes from said electro-optic sensor to a delay line having a quarter-wave reflective termination;

light of the first polarization is reflected as light of the second polarization and the light of the second polarization is reflected as light of the first polarization, by said quarter-wave termination, back into said electro-optic sensor for further modulation with another non-reciprocal phase shift between the light of the first polarization and the light of the second polarization in accordance of the electric field of the voltage to be measured;

light from said electro-optic modulator goes through said Faraday rotator, wherein a static phase shift is introduced between light of the first and second polarizations;

light from said Faraday rotator goes through said polarizer to said detector; and said detector outputs an electrical signal representative of the light and the non-reciprocal phase shift between light of the first polarization and light of the second polarization.

35. The fiber optic voltage sensor of claim 34 further comprising an integrator.

36. The fiber optic voltage sensor of claim 35, wherein:

the electric signal is processed by said signal processor; and said integrator integrates a signal from said processor to yield an output signal that is proportional to the electric field of the voltage to be measured.

37. The fiber optic voltage sensor of claim 36, wherein:

the signal from said processor is the non-reciprocal phase shift between the light of the first polarization and the light of the second polarization, which is proportional to the time derivative of the electric field of the voltage to be measured; and a signal from the integrator is indicative of a magnitude of the voltage to be measured.

38. A voltage sensor comprising:

a light source for providing a first beam;

a polarizer for polarizing the first beam to a first polarization;

a beam splitter for passing a portion of the first beam which is a second beam;

an electro-optic sensor having birefringence axes aligned at about 45 degrees relative to axes of said polarizer, for receiving a first portion of the second beam in the first polarization and a second portion of the second beam in a second polarization, and for birefringently phase modulating the second beam;

a delay line connected to said electro-optic sensor having polarization axes aligned with each other, for delaying the second beam;

a first quarter-wave plate connected to said delay line having polarization axes aligned at about 45 degrees, wherein the second beam is reflected back having the first portion in the second polarization and the second portion in the first polarization;

a second quarter-wave plate, aligned with said electro-optic sensor, for receiving a third beam which is a portion of the second beam reflected by the said first quarter-wave plate through said delay line, electro-optical sensor, and reflected by said beam splitter through said second quarter-wave plate, wherein a first portion of the third beam is of the first polarization and a second portion of the third beam is in the second polarization, and said quarter-wave is for providing about a 90 degree bias phase shift between the first and second portions of said third beam;

a second beam splitter for receiving the third beam from said second quarter-wave plate, and splitting the third beam into the first and second portions;

a first detector for converting the first portion of the third beam into a first electrical signal;

a second detector for converting the second portion of the third beam into a second electrical signal; and a signal processor connected to said first and second detectors, for processing the first and second electrical signals into a signal representing a non-reciprocal phase shift that is proportional to a time derivative of the electric field of the voltage to be measured.

39. The voltage sensor of claim 38, further comprising an integrator for integrating the signal from said signal processor into a signal proportional to the electric field of the voltage to be measured.

* * * * *